United States Patent [19]

Lazarchik et al.

[11] 4,292,638
[45] Sep. 29, 1981

[54] AUGMENTED RADIOMETRIC SYSTEM

[75] Inventors: Robert E. Lazarchik, Largo; Robert S. Roeder, Dunedin, both of Fla.

[73] Assignee: Sperry Corporation, New York, N.Y.

[21] Appl. No.: 154,099

[22] Filed: Jun. 17, 1971

[51] Int. Cl.³ .............................................. G01S 13/86
[52] U.S. Cl. ............................... 343/7.5; 343/17.2 R; 343/100 ME
[58] Field of Search ............ 343/7.5, 17.1 R, 17.1 PF, 343/17.2 R, 100 ME

[56] References Cited
U.S. PATENT DOCUMENTS 3,599,207  8/1971  Foiani et al. ................. 343/100 ME Primary Examiner—Stephen C. Bentley
Attorney, Agent, or Firm—Howard P. Terry

[57] ABSTRACT

An improved microwave radiometric system features the employment of incoherent noise illumination of a selected target for improving the measured radiometric temperature contrast between the target and its spatial background and for increasing the distance at which such a target may be detected. Broad band noise illumination is cyclically transmitted and the receiver is cyclically activated in the high frequency signal comparison system under control of a phase locking loop so that optimum comparison is achieved over a variety of target distances.

12 Claims, 3 Drawing Figures

AUGMENTED RADIOMETRIC SYSTEM

BACKGROUND OF THE INVENTION

1. Field of the Invention

The invention pertains to the art of high frequency radiometry using comparison of the amplitude of a signal to be investigated, such as a thermal or other noise signal, to the amplitude of a locally generated reference signal. In this type of radiometer receiver, an amplitude detector is connected alternately and cyclically through a receiver to an antenna and then to a local reference signal generator. The invention more particularly relates to such a radiometric system in which cyclically operated broad band noise generation apparatus is provided for illuminating the selected target and thus augmenting the apparent temperature of the selected target with respect to its spatial background.

2. Description of the Prior Art

The comparison type of radiometer receiver has been the most widely used for the study of relatively low-level noise-like radio frequency signals, especially where the amplitudes of the noise signals to be examined are often small in comparison to the internally generated noise level within the radiometer receiver. Comparison radiometer systems achieve substantial cancellation of the receiver background noise and self-noise, permitting relatively accurate measurements of low-level radio frequency signals.

While there are other types of comparison radiometers, one popular type of radiometer particularly for use in the high frequency or microwave frequency bands is that in which an incoming signal to be investigated and a standard or calibrated reference noise signal are compared. The method employed consists essentially of the comparison of an unknown noise signal amplitude coming from the source to be examined with a known amplitude noise signal from a calibrated source, and the method can be used to measure the effective temperature of an unknown source with considerable accuracy. In such instruments, the receiver input may be switched between the antenna and the local reference signal generator at a relatively high rate, and the detected and amplified receiver output is coupled to a phase sensing detector operated in synchronism with the switching rate. The final unidirectional output signal from such a radiometer receiver is proportional to the difference between the temperature of the reference signal source and the temperature of the source viewed by the antenna, since the phase sensing detector acts automatically to subtract the receiver background or internal noise.

Passive radiometric systems, including those of the above described kind, have distinct advantages in that they are passive and therefore do not interfere with the operation of other radio equipment; they also operate with utility in most types of weather, are simple and reliable, and are relatively inexpensive. However, the performance of such prior art radiometric systems with respect to targets at relatively great ranges has been less than fully satisfactory because of the limited basic radiometric temperature contrast between such selected targets and their spatial background. Furthermore, there is a significantly increasing dilution effect at large target distances because of the constant angular width receptivity pattern of antennas normally employed in radiometer systems (i.e., as distance increases, the radiometer antenna collects proportionally more spatial background noise with respect to signals received directly from the selected target).

SUMMARY OF THE INVENTION

The present invention is an improved radiometric system providing means for detecting targets at relatively great distances and for accurately performing radiometric measurements thereupon.

In the invention, signals such as target signals to be investigated are received by a suitable antenna and are compared with reference signals provided by a reference signal generator. Normally, the signals being compared are broad band or white noise signals. A high frequency switching device operated at a controllable rate cyclically and repeatedly applies the received and reference signals within the intermediate frequency section of the radiometer receiver. The output of the detector of the radiometer receiver is an alternating signal having a strong component at the same frequency as the controllable frequency at which the high frequency switch is operated. The alternating component is applied through a suitable amplifier to a phase sensitive detector, thence to a signal integrator circuit and for a display on a direct current meter calibrated in terms of temperature.

The novel radiometer equipment may be operated in a substantially conventional manner as a passive radiometric system or may be used in a second mode providing cyclic transmissions of broad band, incoherent noise signals for illumination of a remote target under examination. The broad band noise power is cyclically transmitted, being directed by the radiometer antenna to the selected target. The receiver comparison system and the noise illumination system are synchronously actuated under control of a phase locking loop so that optimum comparison is achieved independent of the actual distance to the selected target. Thus, a fundamental limitation of prior art comparison radiometers is overcome; i.e., the limited temperature contrast of the usual target with respect to its spatial background. The aforementioned dilution effect characteristic of conventional radiometric antennas is essentially circumvented.

DESCRIPTION OF THE PREFERRED EMBODIMENTS

Figure 1:
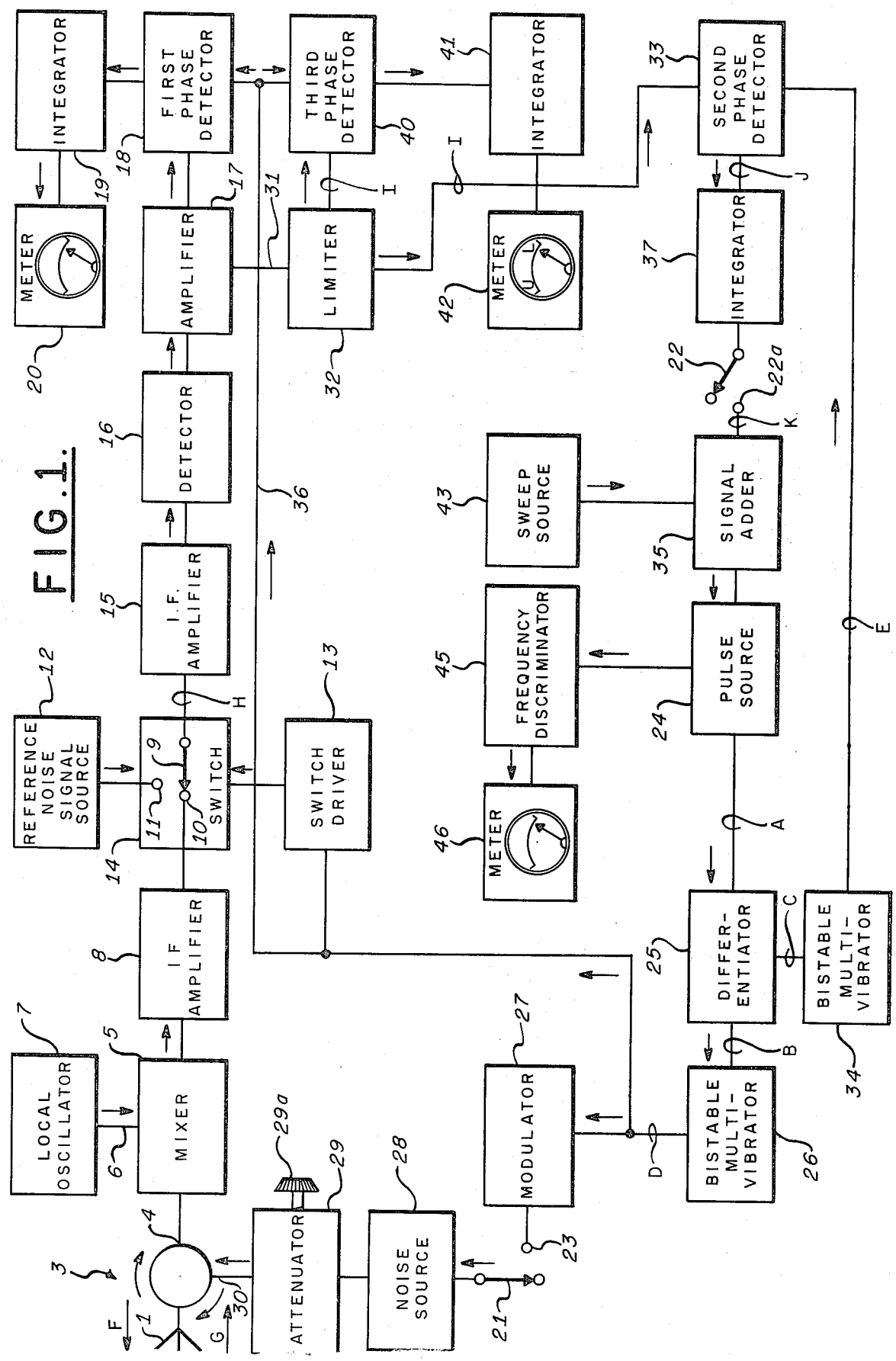
FIG. 1 is a block diagram of the novel radiometric system showing its components and their electrical interconnections.

While shown in block diagram form in FIG. 1, it will be seen that the invention is useful over a wide spectrum of radio frequencies, and that it is of particular merit for use in the high frequency or microwave bands, including those of the ultra high frequency region or higher. It will be understood that the invention is useful in the type of radiometer known in the art as the comparison radiometer. In the usual comparison radiometer, the radiometer receiver is cyclically switched from a receiving antenna to a reference noise signal source.

The invention will be discussed herein in operation in a type of comparison radiometer receiver in which an electronically actuated intermediate frequency switch first connects incoming down-converted signals collected by an antenna to the radio receiver, and then connects instead a reference or broad band or white noise intermediate frequency source to the receiver. Cyclic repetition of this switching process is conventionally employed in the microwave section in certain prior art radiometer concepts. It will be understood that the invention may be employed in a variety of kinds of radiometric systems. For purposes of simplifying the explanation of the invention, however, it is elected to describe its structure and operation in an electronically switched radiometer system.

In FIG. 1, signals G such as, for instance, low-power noise-like radio frequency signals commonly associated with thermal or cosmic radiation generated or reflected by any source to be examined by the radiometer, are received by an antenna 1, which antenna may be any of various known types of broad band microwave or other antennas previously used in the radiometer art. The antenna accepts all signals falling within its pass band and supplies them to a port 2 of a high frequency signal circulator 3 of conventional type having a second port 4 coupled to a conventional mixer 5. Mixer 5 has a second input transmission line 6 to which is coupled an output of continuous wave local oscillator 7. Local oscillator 7 supplies high frequency signals in the usual manner to mixer 5, causing mixing of the two inputs signals for generating a modulated difference frequency signal in the intermediate frequency spectrum for application to broad band intermediate frequency amplifier or preamplifier 8.

The frequency converted output signal generated by mixer or converter 5 is subjected to moderate amplification in intermediate frequency amplifier 8, as required, and is then applied to a terminal or pole 10 of cyclically operated switch 14. An opposite pole 11 of switch 14 is supplied with the output of reference noise signal source or generator 12. The effective blade 9 of switch 14 is coupled to supply the wave H to a second intermediate frequency amplifier 15 for amplification of signal H.

It will be recognized by those skilled in the radiometer art that the switching operation performed by switch 14 may be accomplished prior to signal mixing in mixer 5, if desired, and that other suitable combinations of mixing, amplification, radiometric switching, and reference noise generation well understood in the art may be used. Reference noise source 12 may be either a temperature controlled transmission line load or a semiconductor noise source preferably set at approximately the temperature level of the background noise seen by antenna 1. The noise source 12 may be located in a conventional manner in a coaxial transmission line coupled to switch 14, for example.

The switching device 14 may be a known low-noise high frequency signal transmission switch, as it functions cyclically and alternately to connect antenna 1 or the first reference noise signal source 12 to amplifier 15 serving as the input of the remaining elements of the radiometer receiver. Switch 14 might, for instance, be a conventional ferrimagnetic or semiconductor or other intermediate frequency switch whose state is cyclically changed electronically by driver 13. The switch 14 may, for instance, be a known type of p-i-n diode switch operating in coaxial transmission line.

The output of intermediate frequency amplifier 15, when there is a difference in the levels of signals input at poles 10 and 11, is an amplitude modulated signal, the modulation frequency being the switching repetition rate of switch 14. Envelope detector 16 is used in the conventional manner to remove this substantially square wave modulation from the intermediate frequency envelope, and to pass it through amplifier 17.

In order to compare the phase and amplitude of the signals supplied by envelope detector 16 to amplifier 17, the output of envelope detector 16 is employed as a first input to a first phase detector 18. A second input to the first phase detector 18 must be a reference signal indexed to the phase of the switching cycle of switch 14, so that the same signal generated by pulse source means yet to be explained for operating switch driver 13 and therefore switch 14 is supplied by lead 19 to that second input of first phase detector 18, a device employed in a conventional manner to detect the relative amplitudes of input signals and to evaluate which input signal is the greater.

As in conventional practice, the output of first phase sensitive detector 18 is subjected to the action of a low pass filter or integrator circuit 19, may be amplified by a d.c. amplifier (not shown), and is finally displayed, for instance, by direct current meter 20. The adjustment of driver 13 and the phase of the reference signal driving it relative to operation of switch 14 is such that, when the signal at pole 10 is equal in amplitude to the reference noise signal from source 12, the meter needle points to zero, for instance, on the scale of meter 20. When the signal at pole 10 differs in amplitude with respect to the reference noise signal from source 12, the needle is directed proportionally to one side of the zero indication of meter 20, for example.

The apparatus thus far described will be recognized by those skilled in the art as generally incorporating features employed in prior art practice. In operation, high frequency radiometric signals collected by antenna 1 are subjected to frequency conversion in mixer 5 and pass through switch 14; switch 14 also cyclically, but alternately, passes signals from reference noise signal source 12 to envelope detector 16. The output of envelope detector 16 is supplied to the first phase detector 18, which is the true radiometer signal phase detector, and which produces a unipolar direct current signal whose amplitude is proportional to the difference of the temperature of the effective source viewed by antenna 1 and the constant reference temperature characterizing reference noise signal generator 12, as in standard radiometer comparison receivers of certain types referred to in the R. S. Roeder U.S. patent application Ser. No. 1,497, now U.S. Pat. No. 3,628,151, for a "Radiometer Gain Control", filed Jan. 8, 1970 and assigned to the Sperry Rand Corporation. As will be seen, the apparatus thus far described is a passive radiometer apparatus and may be operated in its passive mode when control switches 21 and 22 are in the non-conducting situation shown in FIG. 1.

In the active mode of the apparatus, switch 21 is moved to contact the switch pole 23 for providing the cyclic transmission of white or broad band noise waves F from antenna 1 for illuminating any selected target of interest. The apparatus involved in supplying incoherent noise signals over a band including the total pass band or pass bands of the radiometer receiver may be described as beginning with the voltage controlled oscillator or pulse source 24, which conventional device generates a substantially square wave A of frequency arbitrarily labeled $2f_o$ for reasons yet to be explained.

Wave A is fed to differentiator 25, a commonly used circuit for producing positive and negative spike pulses corresponding to the vertical excursions of each input square wave cycle in the well known manner. The wave B, composed only of the positive voltage spikes or trigger pulses, is fed to a conventional bistable multivibrator 26 for production of a positive reference square wave D of frequency $f_o$ at reference phase zero degrees, and therefore represented by the symbol $f_o \angle 0°$. It will be understood that wave D is a reference wave fed to the switch driver 13 and to the first phase detector 18 whether the system is in its active or passive mode.

The wave D output of bistable multivibrator 26 is also fed to a conventional modulator 27 which, when switch 21 is conducting, switches or pulse modulates a conventional noise source 28 on and off. The output of noise source 28 is controlled according to the setting of dial 29a of calibrated attenuator 29; accordingly, a calibrated part of the output of noise source 28 is coupled to a third port 30 of circulator 3 for cyclic radiation by antenna 1.

For supply of a voltage for establishing frequency control of pulse source 24 during the active mode of the system, a version of the output of amplifier 17 is connected via lead 31 to limiter 32, forming the limited wave I for application as a first input to the second phase detector 33. The second input to the second phase detector 33 is a reference signal generated under control of pulse source 24 and differentiator 25. The negative going spike pulse output C of differentiator 25 is selected for control of bistable multivibrator 34 for forming a reference square wave train E which may be labeled $f_o \angle 90°$, since it is a quadrature wave needed as a reference signal for proper operation of phase detector 33.

The output of second phase detector 33 becomes a unipolar direct voltage, after the signal is subjected to the action of low pass filter or integrator circuit 19. It may be amplified by a direct current amplifier (not shown), if required, and is then in the active mode of the system passed through switch 22 in the conducting position of the latter to the signal algebraic adder 35 for supply to the frequency controlling terminal of voltage controlled oscillator or pulse source 24.

In operation of the apparatus in the active noise illumination mode, switch blade 21 is placed in contact with terminal 23, so that frequency modulated noise signals F having a band width covering the entire pass band of the radiometer receiver are transmitted from antenna 1 for one half of the radiometer switching cycle as determined by switch driver 13. The illumination source 28 is then switched off for the remaining one half of the cycle while the receiver system is switched on to accept and to process the received radiometer signals. The output signal from radiometer integrator 19 is displayed on electrical meter 20 which is calibrated in units of temperature.

When operated in the active or noise illuminating mode, switch 22 is also closed to contact the terminal 22a, an action which activates the phase locking loop including voltage controlled pulse source 24, multivibrator 34, limiter 32, second phase detector 33, and integrator 37, all of which elements cooperate as will be seen, to hold operation of the reference voltage-controlled pulse generator 24 at the proper frequency $2f_o$. The desired frequency $2f_o$ is that at which the radiometer receiver system is enabled to receive and processes all of the energy in wave G reflected by the illuminated target.

Figure 2:
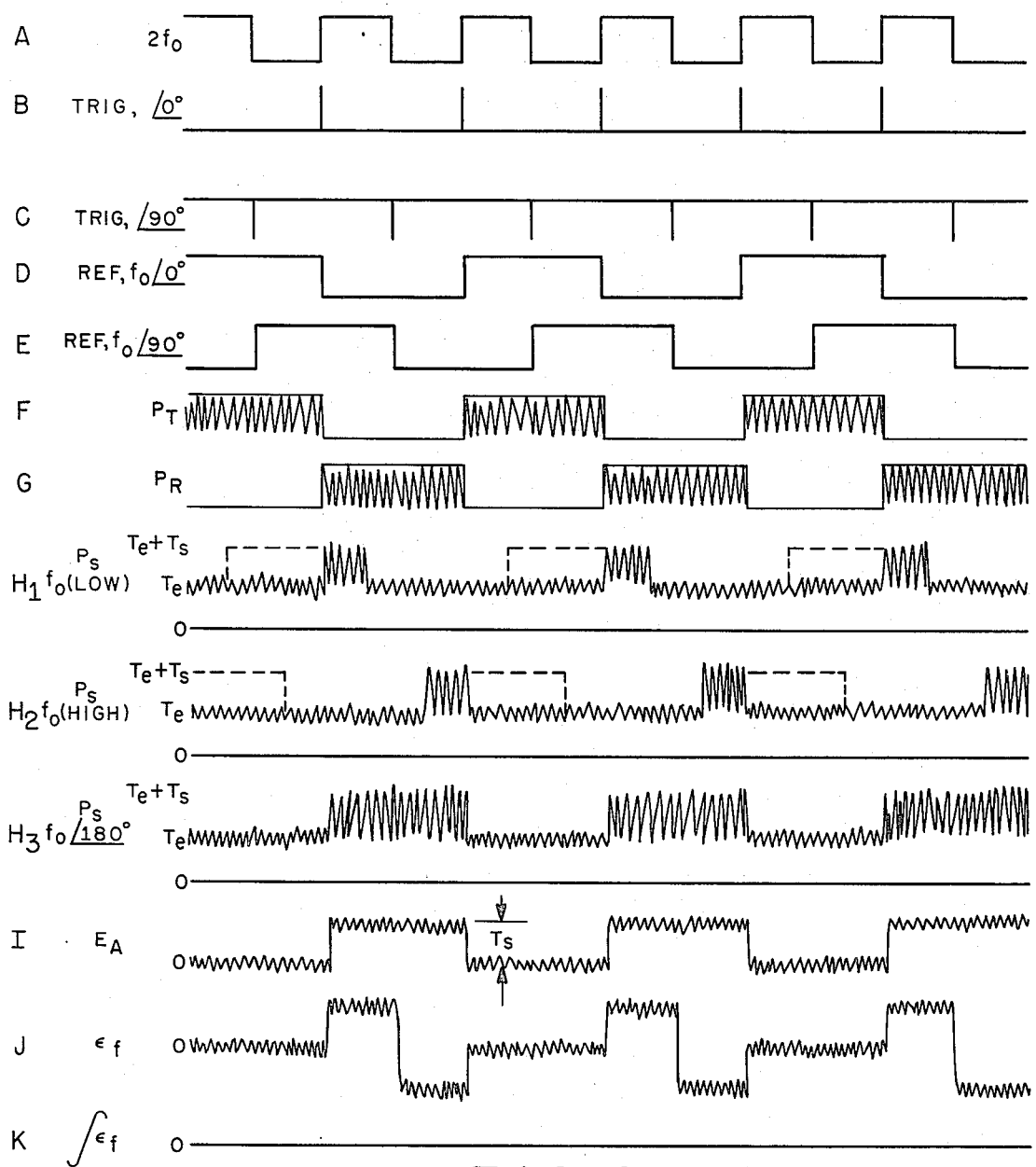
FIG. 2 is a series of wave form graphs useful in explaining the operation of the apparatus of FIG. 1.

Operation of the radiometer receiver system of FIG. 1 will be further understood by reference to wave form graphs A to K of FIG. 2. Quadrature control signals are generated to achieve the desired control of the transmit and receive operations of the radiometer system and to provide for automatic control of the switching rate of switch 14. The output signal A of the voltage controlled pulse generator 24, which is of frequency $2f_o$, is fed to differentiator 25 for the control of quadrature multivibrators 26 and 34. The positive differentiator output in the form of positive trigger pulses B triggers bistable multivibrator 26, whereas the negative output (wave C) of differentiator 25 triggers the loop control multivibrator 34. The consequent output signals from the two bistable multivibrators 26 and 34 are the respective quadrature waves D and E. Waves D and E are characterized by a frequency $f_o$ which is one half the frequency of the pulse generator 24 output.

The voltage controlled oscillator or pulse generator 24 may in practice be operated over an extended frequency range depending upon the desired system operating distance, such as, for example 20 kHz to 200 kHz. Accordingly, the corresponding signals D and E generated by the respective bistable multivibrators 26 and 34 would each range from 10 kHz to 100 kHz, for example.

The noise source 28 generating the noise illumination signal may be a conventional voltage controllable semiconductor noise generator or, alternatively, a backward wave oscillator of known type. Suitable semiconductor noise sources include varactor tuned avalanche transit time or Gunn diode oscillators adapted to yield noise power at levels between 20 and 100 milliwatts. Either kind of noise source is readily frequency modulated by a conventional random noise modulator 27 in such a manner that the entire high frequency output of source 28 is randomly swept over the entire pass band of the radiometer receive system.

The noise transmit-receiver cycle is controlled by the square wave D that drives modulator 27, when noise modulator 27 is switched on, the noise source 28 randomly changes frequency and when noise modulator 27 is switched off, there is no transmission of energy from antenna 1. The output signal of noise source 28 is preferably fed through calibrated attenuator 29 and then to port 30 of circulator 3. Attenuator 29 is provided to permit the transmitted wave F to be regulated in amplitude so that the return signal G falls within the dynamic range of the radiometer receiver system. Accurate measurement of the power of received signal G is made, since the operator has knowledge of the power level of noise source 28, of the setting of calibrated attenuator 29, and of the temperature indication of meter 20 after the switching rate of the radiometer system has been phase locked.

A significant feature of the novel radiometer system in its low-power active mode lies in the use of circulator 3, in that the circulator isolation alone is found adequate to protect mixer 5 and the intermediate frequency preamplifier 8 and to preserve the desirable low noise figure of the radiometer receiver system. Circulator 3 connects antenna 1 to the noise source 28 and serves to isolate the transmitted energy from mixer 5 and the received wave G from noise source 28; circulator 3 normally operates with clockwise energy propagation as indicated by the arcuate arrows around it to couple the noise energy wave F out of antenna 1 and to couple the received wave G into mixer 5. During operation in the active mode, approximately 0.1 to 1.0 percent of the noise source (28) power may leak, for example, through circulator 3 in a sense in reverse of that indicated by the arcuate arrows and may flow into mixer 5. However, the total level of the undesired power will be insufficient to degrade or damage the operating diodes of mixer 5.

As seen in FIG. 2, the signal transmitted to the selected target has the appearance of the square wave switched noise signal F, while the reflected wave G has a similar appearance but is delayed by a time equal to 2R/c (twice the target distance divided by the velocity of propagation in space of wave F). If, at a given range, the square wave switching frequency $f_o$ of noise source 28 is selected so that the received signal, as shown in wave G, is delayed exactly one half the switching rate, then the received wave G that can be detected by the radiometer receiver will have maximum energy and system performance will be optimum. Accordingly, the phase locking loop controlling pulse generator 24 is advantageously used to control the switching rate of switch 14 so as automatically to adjust the radiometer system for optimum performance over a variety of target distances.

During the half cycle of the radiometer receiver system when noise source 28 is not turned on, the received signal G is fed into mixer 5, which mixer may be a conventional low noise, wide band, transmission line balanced mixer operating, for example, at a center frequency of 35 gHz. As noted previously, the radiometer receiver system accepts and processes both the upper and lower high-frequency side bands on each side of the mixer central frequency. Local oscillator 7 may be, for example, a semiconductor oscillator such as a Gunn diode oscillator tuned to the same center frequency of 35 gHz. The intermediate frequency preamplifier 8 and the intermediate frequency amplifier 15 would, in such a circumstance, have pass bands of some 50 to 500 mHz. Thus, the cut off frequencies for the radiometer receiver system may be 34.5 and 35.5 gHz.

The intermediate frequency signal derived in mixer 5 may be amplified by intermediate frequency preamplifier 8. Preamplifier 8 is a low noise, relatively low gain, intermediate frequency preamplifier used in the system to aid in maintaining a low over-all receiver noise figure. The amplified signal appearing as wave H from switch 14 of FIG. 2 is connected to intermediate frequency amplifier 15. Switch 14, which may be a coaxial diode switch, is operated in synchronization with the switching of noise source 28, as noted above.

Switch 14 has two basic functions in the noise illumination or active mode of the radiometer system. First, switch 14 breaks the intermediate frequency signal transmission line between intermediate frequency amplifiers 8 and 15 during the half cycle that the target is being illuminated by energy from noise source 28. With this connection broken, leakage energy and internal reflections in the antenna transmission line system are thus unable to saturate intermediate frequency amplifier 15 and the receiver elements which follow it. Secondly, switch 14 then connects the output of reference noise signal source 12 to amplifier 15, permitting operator balancing of the differential intermediate frequency signal to zero by observation of meter 20. That is, the signal from the reference noise signal source 12 is then adjusted to be equal to the equivalent noise temperature $T_e$ at the input terminals of intermediate frequency amplifier 15 during the half cycle of operation of the system in which wave G is being received.

The consequent signal H appearing at the input to intermediate frequency amplifier 15 is harmonically related to the microwave signal F and depends in its nature upon the system switching rate and the distance to the reflecting target. For example, the three wave forms $H_1$, $H_2$, and $H_3$ in FIG. 2 illustrate the effects of the system switching rate when it varies with respect to the optimum switching frequency. For example, wave $H_1$ illustrates the input to amplifier 15 when the system switching rate is too low with respect to the distance to the target. Similarly, wave form $H_2$ represents the opposite situation which obtains when the system switching rate is too high with respect to the optimum rate. Finally, the wave form $H_3$ represents the optimum condition in that the receiver active time coincides exactly with the time of arrival of the reflected wave G and a maximum amount of the reflected signal is therefore gated into the radiometer receiver system. In wave $H_1$ of FIG. 2, the reflected target is at a closer than optimum range so that the signal G received by antenna 1 begins to arrive while noise source 28 is still on; consequently, only the last part of the received wave G is available for measurement by meter 20. For this condition, the system switching rate is evidently too low and would have to be increased in order for meter 20 to indicate an accurate measurement in terms of the entire signal G reflected by the selected target. In the instance of wave $H_2$, the opposite case is illustrated; wave $H_2$ represents a target at a greater distance than optimum so that only the first part of the received signal G can be measured by meter 20. The system switching rate must be reduced in order for the entire wave G to be accepted and accurately measured.

The optimum switching frequency must have a time period that is twice the time delay characterizing the selected target (i.e., $T_o=4R/c$). In typical operation, it is desired to make radiometric measurements on targets at distances, for example, between 2,500 feet and 25,000 feet and, as noted previously, the system switching rate of the ratiometer system must then be varied over the frequency range from 100 kHz to 10 kHz, respectively. The shortest operational distance sets the requirement for the highest switching frequency and thus also for the largest value of the band width of the circuits following intermediate frequency amplifier 15. Thus, maximum band width for the circuits following intermediate frequency amplifier 15 will be on the order of 1 mHz.

The envelope detector 16 following intermediate frequency amplifier 15 removes the switched modulation envelope, operating as it normally would in conventional radiometer apparatus. The detector diode employed in envelope detector 16 is operated at its square law region, thus assuring that the radiometer receiver response is linear. Amplifier 17 raises the modulation signal input to a level suitable for operation of the first phase detector 18. The output of phase detector 18, after processing by integrator 19, is a direct voltage proportional in amplitude to the difference in signal level that exists between input terminals 10 and 11 of switch 14. When the reference noise signal source 12 is adjusted as previously described to be equal to the receiver noise at the switch terminals, the amplitude of the signal supplied to meter 20 is accurately proportional to the amplitude of the received signal G.

In the active or noise illumination mode of radiometer operation, it is seen that improved measurement accuracy is provided by employing quadrature phase detection of the signal derived by envelope detector 16 and by using the aforementioned phase locking loop for controlling the frequency of pulse source 24 and thus for controlling the radiometer system switching rate. For the latter purpose, a version of the envelope detected signal is supplied by lead 31 to a conventional amplitude limiter 32, thus providing the signal I of FIG. 2 from which amplitude variations originally present on the received signal are removed. Thus, when signal I is supplied to the second phase detector 33 its output (wave J) depends only on the phase relationship between the detected envelope of wave I and the reference input signal $f_o \angle 90°$, which latter is wave E supplied by bistable multivibrator 34. The output of limiter 32 is wave I of FIG. 2 for the optimum frequency condition; the output of the quadrature or second phase detector 33 is wave J of FIG. 2 for the optimum condition. The quadrature output J is proportional to $\cos \theta$, where $\theta$ is the phase difference between wave I and the reference E in the phase locked condition of the loop controlling the frequency $2f_o$ of pulse source 24. The angle $\theta$ is substantially 90° and the output wave K after wave J is processed by integrator 34 is then zero, as indicated by wave K in FIG. 2.

The invention also provides as an additional novel feature a method of indication of the presence or absence of the phase locked condition of pulse source 24. Such is accomplished by the third phase detector 40. Phase detector 40 has two inputs, one for receiving wave D on lead 19, and the other for receiving the limited wave I from amplitude limiter 32. The output of the third phase detector 40 is supplied to an integrator or low pass filter 41 which generates a polarity reversing direct voltage output signal for supply to meter 42. Meter 42 is arranged to show the locked or unlocked status of the phase locking loop. It is observed that the third phase detector 40 operates essentially in parallel with the first phase detector 33. Thus, the first and third respective phase detectors 18 and 40 use the same reference input wave D which is $f_o \angle 0°$ in the locked condition, the angle $\theta$ of the output generated by the third phase detector 40 will be zero degrees; therefore, $\cos \theta$ is substantially unity and the needle of meter 42 will be positioned to give a locked or full scale indication L substantially in the location shown in FIG. 1; on the other hand, when the loop controlling pulse source 24 is not locked, meter 42 will generally indicate a low reading U and will noticeably drift. This is in contrast to the situation for the phase locked condition in which meter 42 provides a full scale and steady deflection.

Figure 3:
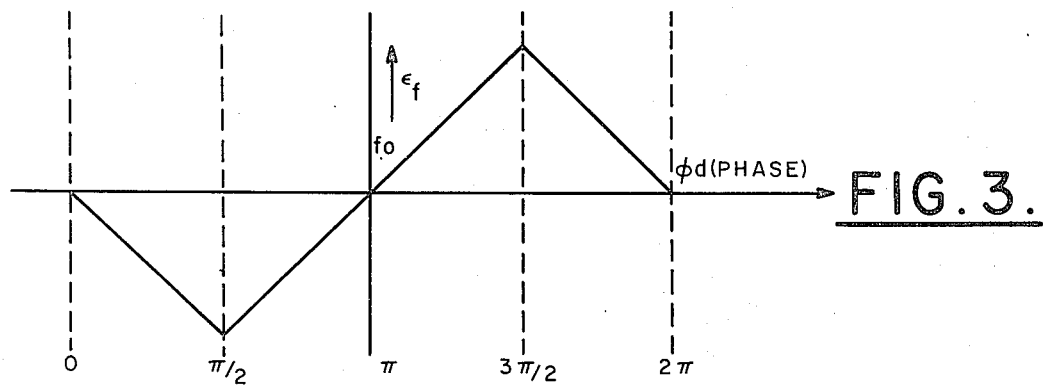
FIG. 3 is a graph useful in explaining the operation of the phase locking loop of the apparatus of FIG. 1.

Actual phase lock of the phase locking loop may be achieved by use of a sweep source 43 of FIG. 1 adapted to apply an increasing ramp voltage to one input of the algebraic adder 35. Alternatively, means may be supplied for applying a step function voltage to an input (not shown) of integrator 34. In either event, an increasing sweep voltage will be applied to the frequency determining terminal of pulse oscillator or generator 24 so that it is swept from its lowest frequency (the longest target distance condition) to increase its output frequency until reaching the capture condition of the phase locking loop that controls pulse source 24. As seen in FIG. 3, which illustrates the composite locking characteristic of the loop, the loop will be locked for a frequency $f_o$ when the phase difference $\theta_d$ between wave forms F and G is equal to $\pi$. The pulse source frequency is $2f_o$ under this condition. The capture range for lock-in extends from $\theta_d = \pi/2$ to $\theta_d = 3\pi/2$. For the fundamental locking frequency of $f_o$, the value $\pi/2$ corresponds to $f_o/2$ and the value $3\pi/2$ corresponds to $3f_o/2$; i.e., the locking band width will be $f_o$ centered at $f_o$. The signal is swept always from its lowest value because other and undesired lock-in conditions exist at odd harmonics ($3f_o$, $5f_o$, et cetera) and are avoided when the desired first lock-in condition is always approached from the low frequency direction.

A further advantage of the active mode radiometer instrumentation lies in the fact that the phase locking operation of the loop controlling pulse source 24 may be used to afford a measure of distance to the selected target. Since the locked frequency of pulse source 24 is proportional to $c/4R$, a frequency discriminator 45 may be coupled to pulse source 24 for distance measurement purposes. Since the output of frequency discriminator 45 is a unidirectional voltage inversely proportional to the distance to the selected target, this discriminator voltage may be applied to a direct current meter 46 whose face is calibrated in any desired distance units.

It is thus seen that the novel radiometer system may be operated either in passive or active modes. It is operated in the passive mode by placing switches 21 and 22 so that they open the contacts of both switches. The reference pulse oscillator source 24 may then be set to a desired operating repetition frequency by adjusting the unidirectional voltage on its frequency-determining terminal by any conventional means. During such passive operation, noise source 28 is not generating output signals and the radiometric system functions generally in the same manner as do prior art comparison radiometers, the comparison switching being accomplished in the intermediate frequency channel of the receiver. The output temperature meter 20 displays the temperature of the received passive signal from the target or other object being examined. The output meter 20 may be calibrated from zero degrees Kelvin to a temperature of several thousand degrees Kelvin.

In its active mode of operation, the radiometer system cyclically supplies augmentation broad band or white noise pulses of energy directed toward the selected target, where such incoherent noise signals produce enhanced target reflections for improving the measured radiometric temperatured contrast between the target and space. Further, the maximum distance at which a target may be detected is increased. The broad band illumination noise signals cyclically transmitted and reflected from the target permit comparison measurement under control of a phase locking loop so that optimum comparison is achieved over a variety of target distances. Thus, inherent limitations of prior art comparison radiometers are overcome, including those caused by limited temperature contrast of normal targets with respect to their spatial backgrounds.

While the invention has been described in its preferred embodiments, it is to be understood that the words which have been used are words of description rather than of limitation and that changes within the purview of the appended claims may be made without departure from the true scope and spirit of the invention in its broader aspects.

We claim:
1. In a radiometric system:

voltage controlled variable frequency circuit means for supplying first and second cyclic signals in substantially phase quadrature relation, first noise source means for space transmission of cyclic noise signals in response to said first cyclic signal, receiver means for receiving versions of said cyclic noise signals, said receiver means having signal envelope detection means, first and second phase detector means, said first phase detector means being responsive to said first cyclic signal and to said signal envelope detector means for producing a signal of amplitude related to the amplitude of said received cyclic noise signals, said second phase detector means being responsive to said second cyclic signal and to said envelope means for producing a frequency control signal, and means for applying said frequency control signal for the control of the operating frequency of said variable frequency circuit means.

2. Apparatus as described in claim 1 additionally including:
directive antenna means, and
signal isolator means connecting in mutually isolated signal propagation relation said first noise source means and said receiver means to said directive antenna means.

3. Apparatus as described in claim 1 additionally including:
reference noise signal source means, and
switch means responsive to said first cyclic signal for cyclically and alternately connecting said signal envelope detector means to said receiver means and to said reference noise signal source means.

4. Apparatus as described in claim 1 additionally including:
first integrator circuit means responsive to said first phase detector means, and
first display means responsive to said first integrator circuit means.

5. Apparatus as described in claim 1 having amplitude limiter means interposed between said envelope detector means and second phase detector means.

6. Apparatus as described in claim 1 having second integrator means interposed between said second phase detector means and said voltage controlled variable frequency circuit means.

7. Apparatus as described in claim 5 additionally including:
third phase detector means responsive to said first cyclic signal and to said amplitude limiter means,
third integrator circuit means responsive to said third phase detector means, and
second display means responsive to said third integrator circuit means.

8. Apparatus as described in claim 1 additionally including:
frequency discriminator means responsive to said voltage controlled variable frequency circuit means, and
third display means responsive to said frequency discriminator means.

9. In a radiometric system:
antenna means,
first noise source means for space transmission of noise signals from said antenna means in first time-separated intervals,
receiver means for receiving versions of said space transmitted signals,
envelope detector means,
second noise source means,
switch means for cyclically coupling said second noise source means to said envelope detector means during said first cyclic intervals and for cyclically coupling said received versions of said space transmitted noise signals thereto during intervals interposed between said first cyclic time-separated intervals,
voltage controlled variable frequency means adapted to control the cyclic operation of said first noise source means and said switch means, and
phase locking loop means responsive to said envelope detector means for controlling the frequency of said voltage controlled variable frequency means for the purpose of maintaining the time durations of said first and interposed intervals in equal, non-overlapping relation.

10. Apparatus as described in claim 9 additionally including
first phase detector means responsive to said envelope detector means and to said voltage controlled variable frequency means,
first integrator means responsive to said first phase detector means, and
first display means responsive to said first integrator means.

11. Apparatus as described in claim 9 wherein said phase locking loop means comprises:
second phase detector means responsive to said envelope detector means and to said voltage controlled variable frequency means, and
second integrator means responsive to said second phase detector means and coupled in controlling relation to said variable frequency means.

12. Apparatus as described in claim 11 additionally including:
third phase detector means responsive to said envelope detector and to said voltage controlled variable frequency means,
third integrator means responsive to said third phase detector means, and
second display means responsive to said third integrator means for displaying the locked or unlocked state of said phase locking loop.

* * * * *